United States Patent [19]
Salvi

[11] Patent Number: 5,557,244
[45] Date of Patent: Sep. 17, 1996

[54] DUAL PORT PHASE AND MAGNITUDE BALANCED SYNTHESIZER MODULATOR AND METHOD FOR A TRANSCEIVER

[75] Inventor: Raul Salvi, Boca Raton, Fla.

[73] Assignee: Motorola, Inc., Schaumburg, Ill.

[21] Appl. No.: 427,677

[22] Filed: Apr. 24, 1995

[51] Int. Cl.$^6$ ............................. H03L 3/00; H03L 7/06; H03L 7/099; H03D 3/00
[52] U.S. Cl. ..................... 332/128; 331/2; 331/17; 331/18; 331/23; 331/36 C; 331/177 V; 327/156; 375/376; 455/75; 455/113; 455/208; 455/260; 329/325
[58] Field of Search ........................ 331/2, 8, 17, 18, 331/23, 25, 34, 36 C, 177 V; 332/127, 128; 327/156–159; 375/376; 455/75, 76, 42, 113, 208, 260; 329/325, 326

[56] References Cited

U.S. PATENT DOCUMENTS 3,622,913  11/1971  Shipley ............................. 332/128
4,074,209  2/1978  Lysobey ............................. 331/23 X
4,447,792  5/1984  Wynn ................................ 331/23 X
5,126,699  6/1992  Kabler .............................. 332/128 X
5,323,125  6/1994  Hiben et al. ....................... 331/23 X

*Primary Examiner*—David Mis
*Attorney, Agent, or Firm*—Keith A. Chanroo

[57] ABSTRACT

A transceiver (10) includes a dual port phase and magnitude balanced synthesizer modulator (60). The modulator (60) couples a modulation input to a voltage controlled oscillator (40) and to a reference oscillator (42) that are coupled together in a phase locked loop (44). The modulator 60 includes a magnitude balancing circuit (64) that divides a modulation input representing data or the like into a first modulation input signal applied to the reference oscillator (42) and a second modulation input signal for the voltage controlled oscillator (40). A phase balancing circuit (68) induces a negative phase shift in the second modulation input signal that is coupled to the voltage controlled oscillator (40) in order to compensate for the phase lag of the reference oscillator loop (44).

22 Claims, 3 Drawing Sheets

DUAL PORT PHASE AND MAGNITUDE BALANCED SYNTHESIZER MODULATOR AND METHOD FOR A TRANSCEIVER

FIELD OF INVENTION

The present invention relates to a modulator for a synthesizer loop in a transceiver and more particularly to a synthesizer modulator having two modulation ports that are balanced in both phase and magnitude.

BACKGROUND OF THE INVENTION

Synthesizers utilized in known radio frequency (RF) communication devices, such as an RF transmitter, have included a voltage controlled oscillator and a reference oscillator coupled together in a phase locked loop. A modulation input is coupled to both the voltage controlled oscillator and the reference oscillator wherein the voltage controlled oscillator is responsive to high frequency modulation inputs and the reference oscillator is responsive to low frequency modulation inputs. In such systems, it is desirable that a given peak to peak voltage input causes a particular change in the frequency of the signal output from the voltage controlled oscillator. If a change in frequency that is greater than the desired change results, it is possible that the communication device will enter a different communication channel than the one desired. Alternatively, if the change in frequency is too low, it will not be accurately detected and decoded by the intended receiver. Further, inbalances in the high and low frequency modulation ports of the voltage controlled oscillator and reference oscillator can create modulation distortions.

In order to equalize the frequency deviation response produced by the voltage controlled oscillator modulation port and the reference oscillator modulation port, one known approach has included modifying the magnitude of the modulation inputs applied to the voltage controlled oscillator and the reference oscillator. However, although this approach is simple, it does not equalize phase differences present in the two modulation paths. This may result in unacceptable distortion in the frequency deviation response produced by the modulation ports.

SUMMARY OF THE INVENTION

In accordance with the present invention, the disadvantages of prior modulators utilized in a synthesizer based RF transmitters and/or receivers have been overcome. The modulator of the present invention includes two modulation ports that are balanced in both phase and magnitude. In addition to reducing modulation distortion by providing phase and magnitude balancing, the modulator of the present invention allows a four-level signal to be modulated in a synthesized loop that is utilized for both the transmission and reception of RF information.

More particularly, the dual port modulator of the present invention is utilized in a transceiver having a voltage controlled oscillator and a reference oscillator that are coupled in a phase locked loop wherein the modulator couples a modulation input to the voltage controlled oscillator and the reference oscillator in a manner to provide both phase and magnitude balancing. The modulator circuit includes a magnitude balancing circuit that divides the modulation input into a first modulation input signal for the reference oscillator and a second modulation input signal for the voltage controlled oscillator. The magnitude balancing circuit adjusts the magnitudes of the first and second modulation input signals independently of the phase of the modulation input. A phase balancing circuit is coupled between the second modulation input signal and the voltage controlled oscillator to induce a negative phase shift in the second modulation input signal. This negative phase shift compensates for the phase lag associated with the reference oscillator loop.

These advantages and novel features of the present invention, as well as details of an illustrated embodiment thereof, will be more fully understood from the following description and the drawings.

DESCRIPTION OF THE PREFERRED EMBODIMENT

Figure 1:
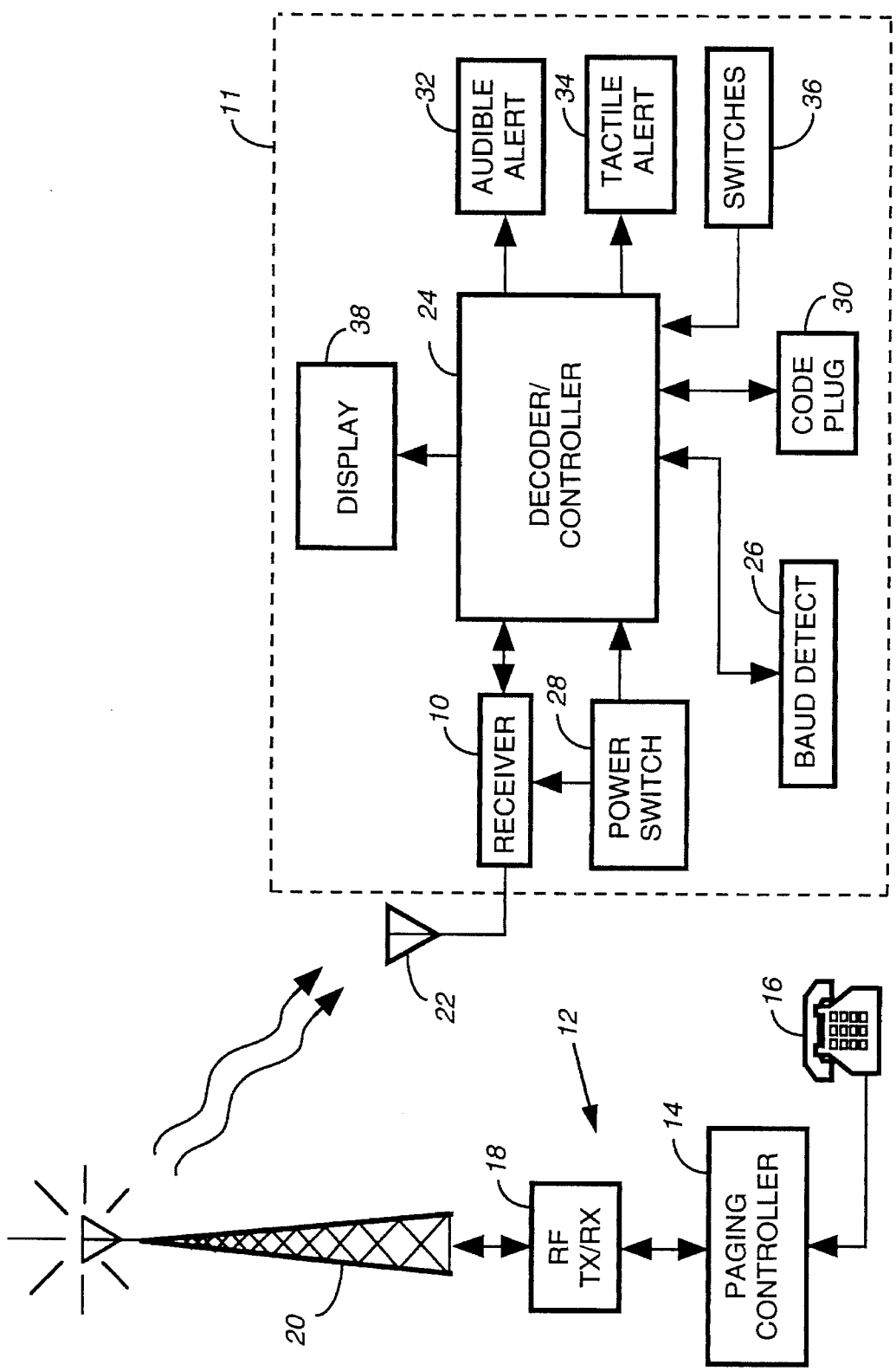
FIG. 1 is a block diagram of a RF communication network illustrating a paging device utilizing the transceiver modulator of a preferred embodiment of the present invention.

A transceiver 10 is shown in FIG. 1 as included in a radio frequency (RF) communication device 11 that may be a pager or the like. Although the pager 11 is illustrated as receiving radio frequency signals from a paging network 12, in the preferred embodiment, the pager 11 also transmits information. Furthermore, the information transmitted and received by the pager 11 may include voice information as well as digital data.

The paging network 12 includes a paging controller 14 that receives input messages or page initiation messages from an input device such as a telephone 16. The paging controller 14 generates a paging message in accordance with a particular signalling protocol, for example, a four-level FSK signal protocol such as FLEX. The paging message generated by the paging controller 14 is coupled therefrom to a RF transmitter/receiver 18. The RF transmitter/receiver 18 transmits the paging message via an antenna 20 for reception by a particular pager 11 in accordance with an identification of the pager that is included in the paging message.

The pager 11 includes an antenna 22 for intercepting transmitted RF signals and for transmitting RF signals. The antenna 22 couples a received signal to the transceiver 10 wherein the transceiver 10 produces a data stream representative of a demodulated received signal that is coupled to a decoder/controller 24. The transceiver 10 is also responsive to a modulation input, such as data, received from the decoder/controller 24 to frequency modulate a carrier signal for transmission out from the pager 11. The transceiver 10 also received an automatic frequency control (AFC) signal from the decoder/controller 24 to control the frequency of a reference local oscillator contained in the transceiver as described below.

As is well known in the art, the decoder/controller 24 may include a central processing unit such as a microprocessor or the like for processing demodulated signal information in accordance with software stored in a memory of the decoder/controller 24. The decoder/controller 24 is also responsive to inputs from one or more switches 36 or other input devices to generate data that is coupled to the transceiver 10 for transmission. A baud detector 26 is coupled to the decoder/controller 24 in order to detect the baud rate of a received paging signal as is well known in the art. A power switch 28 is also coupled to the decoder/controller 24 in order to control the supply of power to the transceiver 10, thereby providing a battery saving function.

The RF signals transmitted by the network 12 typically include an address that identifies a particular pager 11 as well as an associated alpha and/or numeric message. The decoder/controller 24 decodes a received address by comparing it with one or more addresses stored in a code plug or a code memory 30. If the decoder/controller 24 detects a match between a received address and a stored address, an alert signal is generated to alert a user that a page has been received by the device 11. The alert signal is directed to an audible alerting device 32 for generating an audible alert or to a tactile alerting device 34 for generating a silent vibrating alert. Switches 36 allow the user of the pager to input data to the device 11 for transmission. The switches 36 also allow the user to select between the audible alert 40 and the tactile alert as well as for causing a message stored in the memory of the decoder/controller 24 to be accessed for display on a display 38. The switches 36 may also provide additional functions such as reset, read, delete, etc., as is well known.

Figure 2:
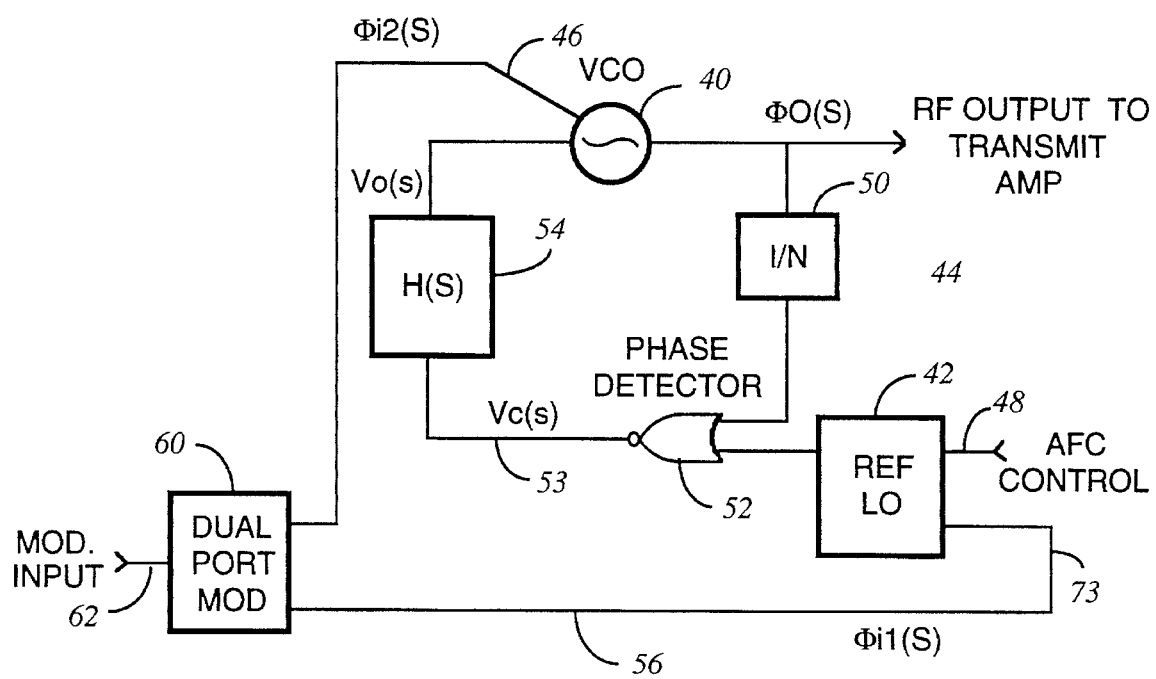
FIG. 2 is a block diagram of a synthesizer loop of the transceiver of FIG. 1 utilizing the dual port modulator of the present invention.

The transceiver 10 includes a voltage controlled oscillator (VCO) 40 as shown in FIG. 2 coupled to a reference local oscillator 42 in a synthesizer or phase locked loop 44. The VCO 40 is responsive to high frequency modulation inputs whereas the reference local oscillator 42 is responsive to low frequency modulation inputs to allow the transceiver 109 to operate over a wide band for both voice and data communications. The VCO 40 modulates the frequency of a carrier signal with data represented by a modulation input signal applied to the VCO on line 46. The VCO 40 is locked in phase to the output of the reference local oscillator 42 by the loop 44. The output of the reference local oscillator 42 has a frequency which is controlled by an automatic frequency control signal applied thereto on a line 48. The output from the reference local oscillator 42 is applied to a phase detector 52 for comparison to the output of the VCO 40 which is coupled to the detector 52 by a divider 50. The divider 50 divides the frequency of the desired signal output from the VCO 40 by N which is equal to the frequency of the VCO divided by the frequency of the reference local oscillator so as to bring the output of the VCO 40 down into the frequency range of the reference local oscillator 42. The phase detector 52 is responsive to the scaled down VCO output coupled from the divider 50 and the output from the reference local oscillator 42 to provide a phase error signal on a line 53. The phase error signal on line 53 is coupled to a loop filter 54 having a low pass response. The output of the loop filter is then coupled to the VCO 40 to drive the VCO 40 in phase with the reference local oscillator 42.

The inputs to the VCO 40 and the reference local oscillator 42 on respective lines 46 and 56 provide dual ports for modulation. The dual port modulation functions to cancel the error signal that occurs at the output of the phase detector 52 when the VCO 40 is modulated. More particularly, when the VCO 40 is modulated by a modulation input signal applied on line 46, the output of the divider 50 will also be modulated. This, in turn causes the output voltage of the phase detector 52 to be modulated since the output of the phase detector 52 is proportional to the phase difference between the outputs of the reference local oscillator 42 and the divider 50. If the output of the reference local oscillator is not modulated, the output of the phase detector 52 and filter 54 will tend to cancel the modulation introduced at the VCO modulation port especially at lower modulation rates. However, by modulating the output of the reference local oscillator 42 by a modulation input signal 56 that is balanced in both magnitude and phase with the VCO modulation input signal 46, any magnitude and phase differences that develop due to the dual modulation paths will be equalized, thus reducing modulation distortion. The dual port modulator 60 is responsive to a modulation input applied thereto on a line 62 to provide to the VCO 40 and reference oscillator 42, modulation input signals 46 and 56 that are balanced in both magnitude and phase. Thus, any amplitude difference and phase lag between the two modulation paths of the respective VCO 40 and oscillator 42 is equalized thereby reducing modulation distortion.

Figure 3:
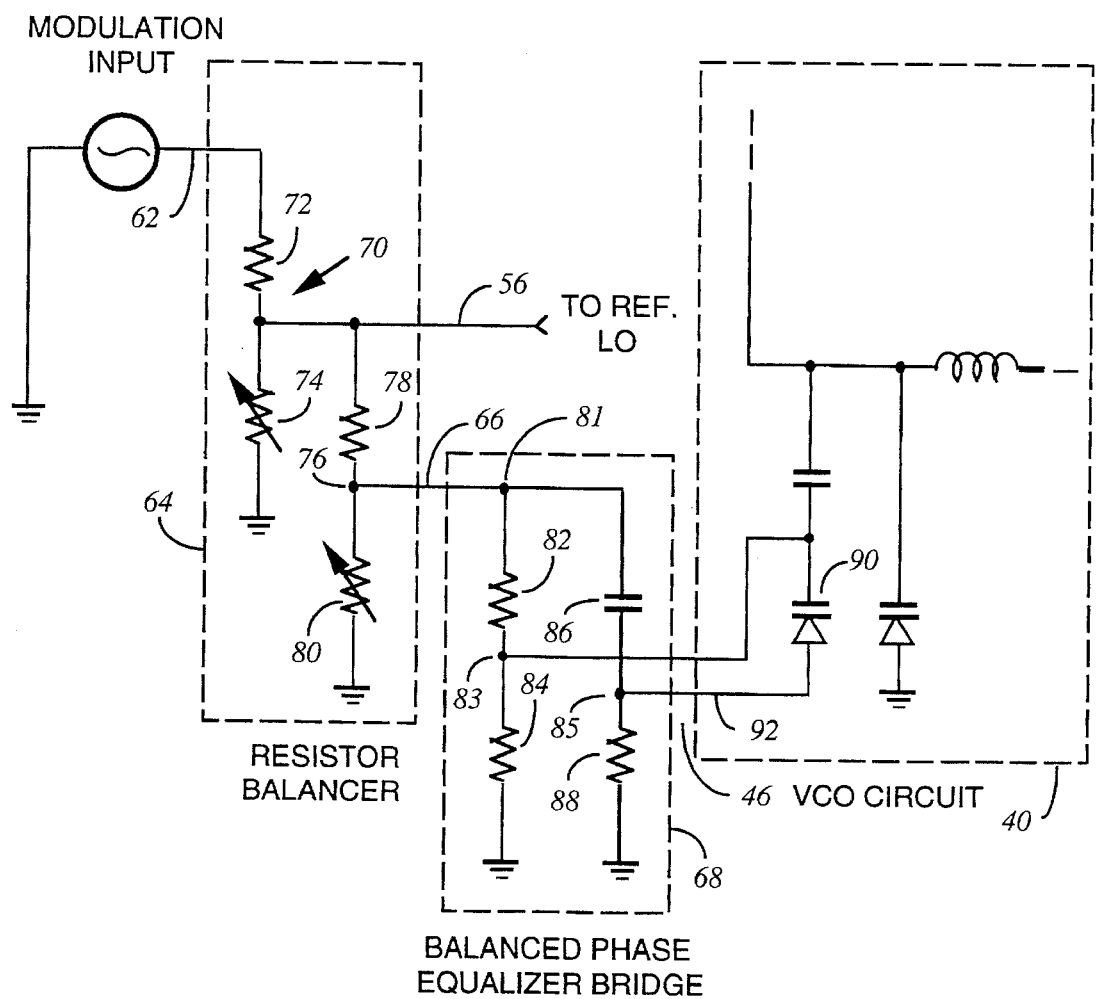
FIG. 3 is a simplified circuit diagram illustrating the dual port modulator of FIG. 2

More particularly, the dual port modulator 60 is depicted in FIG. 3 as having a magnitude balancing circuit 64 that receives a modulation input applied thereto on line 62 from the decoder/controller 24. The magnitude balancing circuit 64 divides the modulation input into a first modulation input signal that is applied on line 56 to the reference local oscillator 42 and into a second modulation input signal that is applied on a line 66 to a phase balancing circuit 68. The phase balancing circuit 68 induces a phase lead into the modulation input signal applied to the VCO 40 in order to compensate for the phase difference associated with the reference local oscillator low pass loop 44. Therefore, both the magnitude and phase distortions produced by the phase locked loop 44 are counterbalanced in the modulation of the VCO modulation input signal so as to equalize the deviation response produced by both modulator parts.

The magnitude balancing circuit 64 is a resistor balancer that adjusts the magnitudes of the first and second modulation input signals on lines 56 and 46 independently of the phase of the modulation input applied to the circuit 64 on line 62. The magnitude balancing circuit 64 includes a first voltage divider 70 that includes a resistor 72 and a variable resistor 74. The output of the first voltage divider 70 is coupled to the modulation input port 73 of the reference local oscillator 42. The output from the voltage divider 70 is also applied to a second voltage divider 76 formed of a resistor 78 and a variable resistor 80. The output of the second voltage divider 76 is applied on line 66 to the phase balancing circuit 68.

The phase balancing circuit 68 adjusts the phase of the VCO modulation input signal, i.e. the second modulation input signal on line 46, relative to the phase of the reference local oscillator input signal on line 56 and independent of the magnitude of the second modulation input signal. The phase balancing circuit 68 is an all pass filter or delay equalizer the output of which preferably changes linearly but inversely with frequency to compensate for the phase lag between the VCO 40 and loop 44 of the reference local oscillator 42. The circuit 68 includes a pair of resistors 82 and 84 connected in series between a node 81 and ground. The circuit 68 also includes a capacitor 86 in series with a resistor 88 coupled between the node 81 and ground. The output voltage of the phase balancing circuit 68 taken at nodes 83 and 85 is applied across a varactor 90 of the voltage controlled oscillator 40. At low frequencies, the capacitor 86 acts essentially as an open circuit to induce a zero degree phase shift in the second modulation input signal. As the frequency of the modulation input increases from a low frequency to a high frequency, the voltage applied across the varactor 90 increases inducing a greater negative phase shift into the modulation port 92 of the VCO 40. At high frequencies, the capacitor 86 acts as a short circuit providing a 180° phase shift.

The dual port modulator 60 of the present invention may be tuned utilizing the variable resistor 74 and 80 of the magnitude balancing circuit 64, the phase balancing circuit 68 being a fixed tuned device. At the start of the tuning operation, both of the resistors 74 and 80 are tuned to low values so that the two modulation input signals on lines 46 and 56 will be low in amplitude with low FM deviations. Next, the resistor 74 is tuned by first setting the modulation input on line 62 to a known DC level under the control of the decoder/controller 24 in order to produce a centered carrier signal. Once the carrier is centered, the DC level is switched between high and low waveform excursions or levels and the resistor 74 is tuned until the deviations in the waveform excursions are a predetermined amount, for example, + and –4.5 kHz, from the center frequency of the carrier. The resistor 80 is then tuned to provide the balanced VCO modulation input signal by providing a 2 kHz square wave modulation input on line 62. The RF output from the VCO 40 may then be inductively picked up and applied to a spectrum analyzer so that two spectral peaks are displayed on the analyzer as being symmetrically disposed about the center frequency of the carrier and separated by an amount that is less than 2 times 4.5 kHz in the above example. The resistor 80 is then tuned until the two peaks displayed on the spectrum analyzer are exactly 2 times 4.5 kHz apart.

The dual port modulator of the present invention with both magnitude and phase balancing allows a four-level FSK signal to be modulated in the synthesized loop 44 to allow for carrier frequency agility while utilizing the same VCO 40 and loop 44 for transmitting information as well as for receiving information. Therefore, the same synthesizer integrated circuit may be used for both the transmitting and receiving functions resulting in significant space and cost savings. The modulator further allows for the transmission of a wide band so that it may be used for voice transmission as well as data transmission.

Many modifications and variations of the present invention are possible in light of the above teachings. Thus, it is to be understood that, within the scope of the appended claims, the invention may be practiced otherwise than as described hereinabove.

What is claimed is:

1. In a transceiver having a voltage controlled oscillator and a reference oscillator coupled in a phase locked loop to the voltage controlled oscillator, a circuit for coupling a modulation input to the voltage controlled oscillator and the reference oscillator comprising:

a magnitude balancing circuit for dividing said modulation input between said voltage controlled oscillator and said reference oscillator for providing a pair of modulation input signals having balanced magnitudes coupled respectively to said oscillators, said magnitude balancing circuit adjusts the balanced magnitude of each of said pair of modulation input signals independent of the phase of said modulation input; and a phase balancing circuit coupled between said modulation input and said voltage controlled oscillator to induce a negative phase shift in the modulation input signal coupled to said voltage controlled oscillator.

2. A circuit in a transceiver for coupling a modulation input to the voltage controlled oscillator and the reference oscillator as recited in claim 1 wherein said phase balancing circuit adjusts the phase of said modulation input signal coupled to said voltage controlled oscillator independently of the magnitude of said signal.

3. A circuit in a transceiver for coupling a modulation input to the voltage controlled oscillator and the reference oscillator as recited in claim 1 wherein said phase balancing circuit includes a bridged all pass filter network coupled between said magnitude balancing circuit and an input of said voltage controlled oscillator.

4. A circuit in a transceiver for coupling a modulation input to the voltage controlled oscillator and the reference oscillator as recited in claim 1 wherein said magnitude balancing circuit includes a first voltage divider the output of which is coupled to said reference oscillator; and a second voltage divider coupled between the output of said first voltage divider and an input of said phase balancing circuit.

5. A circuit in a transceiver for coupling a modulation input to the voltage controlled oscillator and the reference oscillator as recited in claim 4 wherein each of said first and second voltage dividers includes a variable resistor for tuning.

6. In a transceiver having a voltage controlled oscillator and a reference oscillator coupled in a phase locked loop to the voltage controlled oscillator, a circuit for coupling a modulation input to the voltage controlled oscillator and the reference oscillator comprising:

a magnitude balancing circuit coupled at an input thereof to said modulation input for providing a first modulation input signal with a first magnitude for said reference oscillator and a second modulation input signal with a second magnitude for said voltage controlled oscillator, said magnitude balancing circuit adjusting the magnitudes of said first and second modulation input signals independently of the phase of said modulation input; and a phase balancing circuit coupled to one of said modulation input signals for adjusting the phase of said one modulation input signal relative to the phase of the other modulation input signal and independent of the magnitude of said one modulation input signal.

7. A circuit in a transceiver for coupling a modulation input to the voltage controlled oscillator and the reference oscillator as recited in claim 6 wherein said phase balancing circuit is coupled to said second modulation input signal.

8. A circuit in a transceiver for coupling a modulation input to the voltage controlled oscillator and the reference oscillator as recited in claim 7 wherein said phase balancing circuit induces a negative phase shift in said second modulation input signal.

9. A circuit in a transceiver for coupling a modulation input to the voltage controlled oscillator and the reference oscillator as recited in claim 6 wherein said phase balancing circuit includes a bridged all pass filter network.

10. A circuit in a transceiver for coupling a modulation input to the voltage controlled oscillator and the reference oscillator as recited in claim 6 wherein said magnitude balancing circuit includes a first voltage divider for providing said first modulation input signal and a second voltage divider for providing said second modulation input signal.

11. A circuit in a transceiver for coupling a modulation input to the voltage controlled oscillator and the reference oscillator as recited in claim 10 wherein each of said first and second voltage dividers includes a variable resistor for tuning.

12. In a transceiver having a voltage controlled oscillator and a reference oscillator coupled in a phase locked loop to the voltage controlled oscillator, a circuit for coupling a modulation input to the voltage controlled oscillator and the reference oscillator comprising:

a first voltage divider coupled at an input thereof to said modulation input to provide at an output thereof a first modulation input signal to be coupled to said reference oscillator;

a second voltage divider coupled at an input thereof to the output of said first voltage divider to provide at an output thereof a second modulation input signal;

a phase adjusting circuit coupled at an input thereof to said second modulation input signal for providing a phase shifted input signal to said voltage controlled oscillator.

13. A circuit in a transceiver for coupling a modulation input to the voltage controlled oscillator and the reference oscillator as recited in claim 12 wherein said phase shifted input signal has a negative phase shift relative to said first modulation input signal.

14. A circuit in a transceiver for coupling a modulation input to the voltage controlled oscillator and the reference oscillator as recited in claim 12 wherein each of said first and second voltage dividers includes a variable resistor for tuning.

15. A method for coupling a modulation input to a voltage controlled oscillator of a transceiver and to a reference oscillator coupled in a phase locked loop to said voltage controlled oscillator, said method comprising the steps of:

dividing said modulation input into a first modulation input signal and a second modulation input signal;

adjusting a magnitude of the first modulation input signal and the second modulation input signal independent of the phase of said first modulation input signal and the second modulation input;

coupling said first modulation input to said reference oscillator;

shifting the phase of said second modulation input signal to provide a phase shifted modulation input signal; and coupling said phase shifted modulation input signal to said voltage controlled oscillator.

16. A method for coupling a modulation input to a voltage controlled oscillator of a transceiver and to a reference oscillator coupled in a phase locked loop to said voltage controlled oscillator, said method comprising:

adjusting the magnitude of said modulation input independent of the phase thereof to provide a first modulation input signal for said reference oscillator and a second modulation input signal for said voltage controlled oscillator; and adjusting the phase of one of said modulation input signals relative to the phase of the other modulation input signal and independent of the magnitude of said one modulation input signal.

17. A method as recited in claim 16 further including the step of coupling said phase adjusted modulation input signal to said voltage controlled oscillator and coupling said first modulation input signal to said reference oscillator.

18. A method as recited in claim 17 wherein said phase adjusting step includes inducing a negative phase shift in said second modulation input signal.

19. A method as recited in claim 16 wherein said magnitude adjusting step includes dividing said modulation input to provide said first modulation input signal using a first voltage divider having a first variable resistor; and coupling an output of said first voltage divider to a second voltage divider having a second variable resistor, said second voltage divider providing said second modulation input signal.

20. A method as recited in claim 19 further including the step of tuning said variable resistors.

21. A method as recited in claim 20 wherein said tuning step includes;

setting said modulation input to a known direct current level to provide a centered carrier signal for said voltage controlled oscillator;

switching said direct current level between a high level and a low level; and adjusting said first variable resistor while switching said direct current level until a predetermined positive deviation and negative deviation is obtained in said carrier signal relative to a center frequency thereof.

22. A method as recited in claim 21 wherein said tuning step further includes:

applying a modulation input in the form of a square wave having a known frequency to said first voltage divider;

coupling the output of said voltage controlled oscillator to a spectrum analyzer to obtain a pair of spectral peaks displayed on said analyzer as symmetrical about the center frequency of said carrier signal; and adjusting said second variable resistor until said peaks are displayed on said analyzer as being separated by a an amount equal to two times said predetermined deviation.

* * * * *